United States Patent
Ridley et al.

(10) Patent No.: US 6,465,325 B2
(45) Date of Patent: Oct. 15, 2002

(54) PROCESS FOR DEPOSITING AND PLANARIZING BPSG FOR DENSE TRENCH MOSFET APPLICATION

(75) Inventors: Rodney S. Ridley; Frank Stensney; John L. Benjamin, all of Mountaintop, PA (US); Jack H. Linn, Melbourne, FL (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/082,944

(22) Filed: Feb. 26, 2002

(65) Prior Publication Data

US 2002/0119639 A1 Aug. 29, 2002

Related U.S. Application Data

(60) Provisional application No. 60/271,832, filed on Feb. 27, 2001.

(51) Int. Cl.[7] .............................................. H01L 21/76
(52) U.S. Cl. ........................ 438/428; 438/430; 438/435
(58) Field of Search ................................. 438/221, 296, 438/424, 425, 430, 431, 435, 428

(56) References Cited

U.S. PATENT DOCUMENTS

| 5,435,888 | A | * | 7/1995 | Kalnitsky et al. ............. 216/18 |
| 5,902,127 | A | * | 5/1999 | Park ............................ 438/435 |
| 6,010,948 | A | * | 1/2000 | Yu et al. ...................... 438/436 |
| 6,020,230 | A | * | 2/2000 | Wu .............................. 438/222 |
| 6,214,698 | B1 | * | 4/2001 | Liaw et al. .................. 438/435 |
| 6,265,281 | B1 | * | 7/2001 | Reinberg ..................... 438/400 |

FOREIGN PATENT DOCUMENTS

| JP | 2-238647 | * | 9/1990 | ........... H01L/21/76 |
| JP | 4-129222 | * | 4/1992 | ........... H01L/21/76 |
| JP | 4-150052 | * | 5/1992 | ........... H01L/21/76 |
| JP | 7-135247 | * | 5/1995 | ........... H01L/21/76 |
| JP | 7-254610 | * | 10/1995 | ......... H01L/21/331 |
| JP | 10-22372 | * | 1/1998 | ........... H01L/21/76 |

* cited by examiner

*Primary Examiner*—Olik Chaudhuri
*Assistant Examiner*—David S Blum
(74) *Attorney, Agent, or Firm*—Thomas R. Fitzgerald, Esq.

(57) ABSTRACT

A process for filling a trench having sidewalls and a floor in a semiconductor device or integrated circuit comprises: forming an insulating layer on the sidewalls and floor of a trench in a semiconductor substrate, substantially filling the trench with semiconductor material, removing semiconductor material from an upper portion of the trench, depositing a first layer of BPSG in the upper portion of the trench, heating the substrate to a first temperature greater than about 850° C. and up to about 1100° C., depositing a second layer of BPSG above the first layer of BPSG, and heating the substrate to a second temperature greater than about 850° C. and up to about 1100° C. The first and second BPSG layers each comprises boron and phosphorus in a weight ratio of boron: phosphorus of greater than 1:1.

17 Claims, 2 Drawing Sheets

PROCESS FOR DEPOSITING AND PLANARIZING BPSG FOR DENSE TRENCH MOSFET APPLICATION

CROSS-REFERENCE TO RELATED APPLICATION

This application claims priority of U.S. Provisional Patent Application Ser. No. 60/271,832, filed Feb. 27, 2001.

FIELD OF THE INVENTION

The present invention relates to MOSFET semiconductor devices and, more particularly, to a process for depositing and planarizing boron phosphosilicate glass (BPSG) in a narrow trench. The invention can be applied to a power MOSFET containing a trench structure.

BACKGROUND OF THE INVENTION

Borophosphosilicate (BPSG) glass is often used in the manufacture of semiconductor devices, in particular, the manufacture of MOSFETs. It is conventionally employed as an insulator for covering a gate on the surface of the semiconductor device. Typically, a gate is formed over a channel region and separated from the channel by an insulating layer, for example, a gate oxide layer. A BPSG film is conventionally deposited on the gate and heated to cause it to flow, thereby covering the gate and providing a planar insulating surface. Planar surfaces are easier to work with and generate fewer artifacts in further processing. The ability of BPSG to flow and to form a planar surface is a highly desirable feature because it saves a manufacturing step of etching back to planarize an insulating layer. Thus, BPSG is self-planarizing.

Power MOSFET devices and other power devices often rely upon isolation trenches as well as gate trenches. With a gate trench, the gate is buried below the surface and forms in the semiconductor body a channel on the side of the trench between the source on one surface of the die and the drain on the opposite surface. In conventional fabrication, the gates and isolation trenches are formed by etching trenches in silicon, oxidizing the sidewalls, filling the silicon trenches with polysilicon, etching the polysilicon back to a point at or below the surface of the substrate, and then refilling the trenches with a layer of insulating material, typically silicon dioxide or silicon nitride.

Conventional insulator-filled trenches all require a further step of planarization. It would be desirable to replace the silicon dioxide and silicon nitride insulators with BPSG. If a trench were to be filled with BPSG, conceivably the BPSG could be heated to flow and thereby self-planarize as well as fill the trench.

Unfortunately, conventional silane-based BPSG techniques cannot be applied to high aspect ratio silicon trenches, i.e., trenches where the depth:width ratio is greater than 1:1. Etching of polysilicon in a trench produces a surface contour seam shaped like a valley or crater in the center of the polysilicon. Furthermore, conventional BPSG is deposited unevenly around the top corners of a trench, resulting in "breadloafing" that produces voids in the BPSG. When the deposited BPSG material is heated, it fails to flow enough to fill these voids or the seam in the trench. Further processing results in penetration of the voids by impurities that interfere with the performance of the device. Electrical breakdown of the BPSG between the source metal and the polysilicon can result in source-to-gate shorts and leakage. Thus, although BPSG is a desirable insulating material, it cannot be used to fill high aspect ratio trenches by standard procedures.

SUMMARY OF THE INVENTION

The present invention, which provides a method that employs standard deposition and processing equipment to fill trenches with BPSG, is directed to a process for filling a trench having sidewalls and a floor in a semiconductor device or integrated circuit. The process comprises: forming an insulating layer on the sidewalls and floor of a trench in a semiconductor substrate, substantially filling the trench with semiconductor material, removing semiconductor material from an upper portion of the trench, depositing a first layer of BPSG in the upper portion of the trench, heating the substrate to a first temperature greater than about 850° C. and up to about 1100° C., depositing a second layer of silane-based BPSG above the first layer of BPSG, and heating the substrate to a second temperature greater than about 850° C. and up to about 1100° C. In accordance with the invention, the first and second BPSG layers each comprises boron and phosphorus in a weight ratio of boron: phosphorus of greater than 1:1.

DETAILED DESCRIPTION OF THE DRAWINGS

Figure 1:
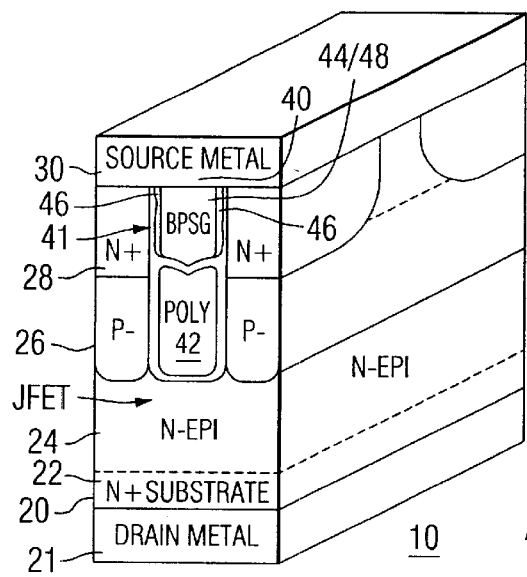
FIG. 1 is a partial perspective view of a MOSFET trench region.
Figure 2:
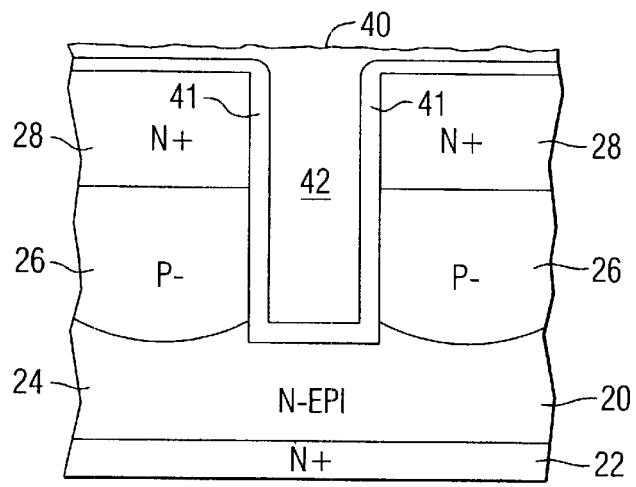
FIGS. 2–6 illustrate the steps of filling a trench in a semiconductor substrate in accordance with the process of the present invention.

Conventional silane-based BPSG films are generally not used to fill trenches. In fact, manufacturers of process equipment recommend against using conventional BPSG films to fill trenches because conventional processes result in voids and multiple surface defects. For example, under normal process conditions in which the flow of BPSG is carried out at temperatures of 875–950° C., the BPSG does not fill the trench because of the voids and the seam in the etched polysilicon. The process of the present invention, which can be carried out using standard process equipment, provides a solution to these problems.

Conventional BPSG comprises substantially equal amounts, by weight, of phosphorus and boron. Typically, boron and phosphorus each comprises about four percent of the deposited BPSG. In accordance with the present invention, the BPSG layer preferably comprises about 4 wt. % to about 6 wt. % boron and about 3 wt. % to about 4 wt. % phosphorus. However, the total concentration of boron and phosphorus dopants should not exceed about 9 wt. %.

The component gases for BPSG films include a source of silicon, preferably silane, along with sources of boron, phosphorus, and oxygen. Typical component gases are silane, diborane, phosphine, and nitrous oxide, and typical deposition conditions are a temperature of about 400° C. and a pressure of about 2.6 torr.

In accordance with the present invention, the BPSG formulation, which is preferably silane-based, is beneficially adjusted by reducing the phosphorus concentration and increasing the boron concentration. In a preferred embodiment, boron is increased to near its saturation limit. It has also been found that increasing the silane improves the overall deposition of the BPSG layer, thereby reducing the expected surface defects. A conventional BPSG deposition recipe contains, for example, gas flows of about 300 sccm of silane, about 800 sccm phosphine, and about 850 sccm diborane. A recipe useful for the practice of the present invention may contain for example, gas flows of about 400 sccm of silane, about 400 sccm phosphine, and about 1600 sccm diborane.

These modifications provide one or more of the following advantages and improvements: (1) increased flowability of the BPSG; (2) planarized substrates without mechanical or chemical lapping, polishing, or grinding; (3) filled seams in the trench polysilicon; (4) reduced voids in trenches filled with BPSG; (5) reduced surface defects in BPSG films; and (6) improvements made with existing process equipment.

The process of the present invention is characterized by two distinct features. First, two separate layers rather than a single film of silane-based BPSG, are deposited and flowed, resulting in filling of the trench without the creation of voids. Second, surface defects are eliminated or minimized by significantly increasing the amount of silane. The inclusion of trenches increases the surface area of a device. The area increase depends on the aspect ratio and the pitch of the trenches. Trenches filled by the process of the present invention have a width of, preferably, about 0.5 $\mu$m, a depth of, preferably, about 0.5 $\mu$m to about 1.0 $\mu$m, and a pitch of, preferably, about 1.0 $\mu$m to about 4.0 $\mu$m, more preferably, about 3.0 $\mu$m.

In another process modification, following removal of semiconductor material from the upper portion of the trench, an insulating barrier layer is formed on the sidewalls of the upper portion. The insulating barrier layer is preferably formed from low temperature oxide, silicon nitride, or silicon oxynitride. Two successive layers of BPSG are applied, one on top of the other. After the first layer of BPSG is applied, the temperature is raised above the conventional temperature of about 850° C., preferably about 1050° C., to a maximum of about 1100° C. Above the latter temperature, a typical barrier layer lining the trench may not prevent autodoping of the phosphorus and boron. However a thicker or more effective barrier may permit a higher flow temperature.

The insulating barrier layer has a thickness preferably of about 0.05 $\mu$m. For trenches having a width of about 0.5 $\mu$m and a pitch of about 3.0 $\mu$m, the first layer of BPSG is preferably about 0.4 $\mu$m thick, and the second BPSG layer is preferably about 0.6 $\mu$m thick. The first layer of BPSG is heated to its flowing temperature before the second layer is deposited.

Changing the ratio of boron to phosphorus in accordance with the present invention increases the flowability, i.e., reduces the viscosity, of the BPSG, especially when the deposited film is raised to the temperature of about 1050° C. At that temperature, the increased boron concentration likely reduces the surface tension of the BPSG film and allows it to flow more readily to fill voids and the polysilicon seam. A typical process flow is shown in the attached figures and will be described as follows.

Turning to FIG. 1, a trench gate structure for a MOSFET and/or IGBT is shown with a BPSG-filled trench. The device 10 is made on a semiconductor die 20 of suitable material, for example, monocrystalline silicon. At the bottom surface of substrate 20, which is covered with a drain metal layer 21, is a highly-doped N+ drain region 22. Above the N+ drain region 22 is a lightly-doped N type epitaxial layer 24 containing a trench 40. The top of trench 40 is flanked by N+ source regions 28, and P- regions 26 are disposed between source regions 28 and the remainder of epitaxial layer 24. Trench 40 is lined with a gate oxide layer 41, and its lower portion is filled with polysilicon 42. A barrier layer 46 covers the upper portion of gate oxide layer 41. The upper portion of trench 40 is filled with BPSG 44/48. A source metal layer 30 is formed over source regions 28 and planarized BPSG layer 44/48.

FIGS. 2–6 show sequential steps in formation of the device 10 of FIG. 1. Substrate 20 is suitably processed to have the N+ drain region 22 on one surface and a plurality of N+ source regions 28 on the opposite surface. P-well regions 26 are formed beneath the source regions 28 and are disposed between the source regions 28 and the rest of the epitaxial layer 20. A gate oxide layer 41 is formed on the sidewalls and the floor of the trench 40. Thereafter, a layer of polysilicon 42 is deposited in trench 40 and over substrate 20. The gate oxide layer 41 forms a resist surface on the upper surface of substrate 20. Using oxide layer 41 as a mask, polysilicon 42 is removed from the upper surface of substrate 20 and from the upper portion of trench 40. The portion of oxide layer 41 on the upper surface of substrate 20 is then removed, yielding the structure depicted in FIG. 3.

Figure 3:
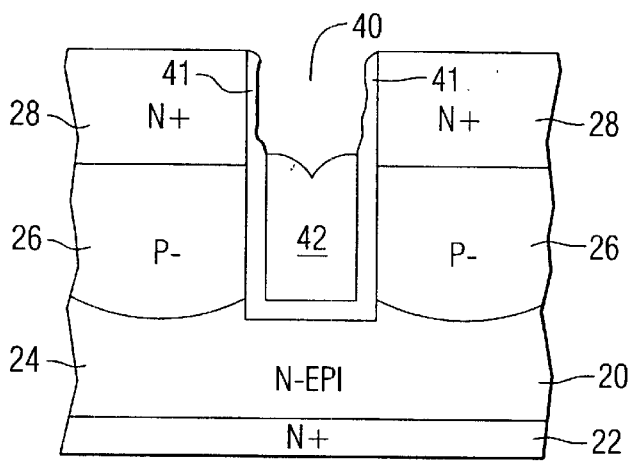
Figure 4:
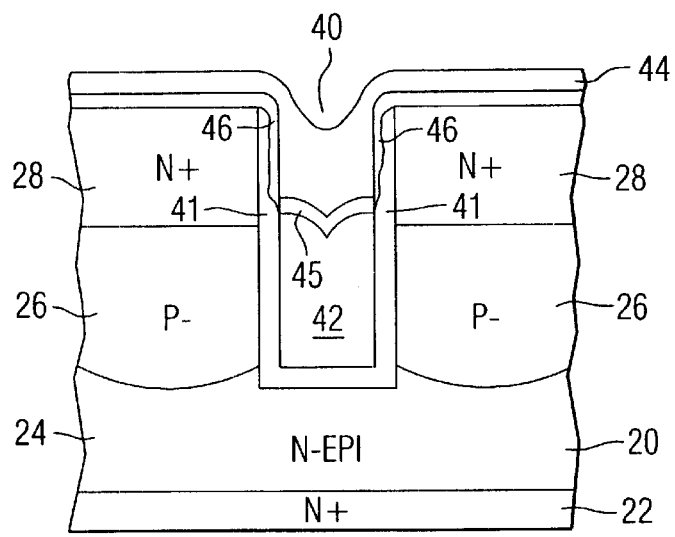

During the removal of polysilicon from trench 40, the sidewall gate oxide layer 41 is damaged, or at least thinned, as shown in FIG. 3. To prevent autodoping into the source regions 28 by boron and phosphorus ions from BPSG, it is necessary to deposit a barrier layer in trench 40. Turning to FIG. 4, a barrier layer 46, which may comprise an oxide, a nitride, or an oxynitride, is uniformly deposited over the substrate and on the sidewalls in the upper portion of trench 40. Barrier layer 46, which preferably is a low temperature oxide layer having a thickness of about 0.05 $\mu$m, effectively seals the sidewalls in the upper portion of trench 40 and prevents autodoping by boron and phosphorus ions of source regions 28.

Also as shown in FIG. 4, a first layer 44 of BPSG is deposited in trench 40. After deposition, BPSG layer 44 is heated to a temperature greater than about 850° C., preferably about 1050° C. During this heating step, a portion of polysilicon 42 in trench 40 is oxidized, forming an oxide layer 45 on top of polysilicon 42.

Figure 5:
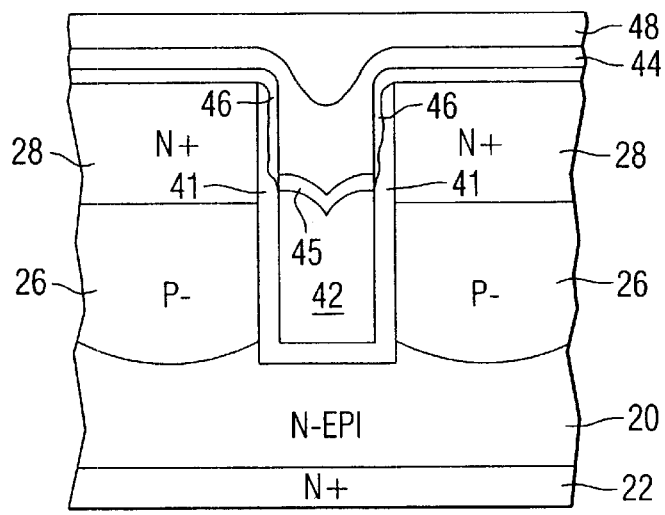

As shown in FIG. 5, a second BPSG layer 48 is uniformly deposited over substrate 20. After deposition, layer 48 is likewise heated to a suitable flowing temperature, about 1050° C. Further oxidation of polysilicon 42 may occur during this heating step, adding to oxide layer 45.

For a trench having a width of about 0.5 $\mu$m and a pitch of about 3.0 $\mu$m, first BPSG layer 44 has a thickness preferably of about 0.4 $\mu$m, and second BPSG layer 48 has a thickness preferably of about 0.6 $\mu$m.

Figure 6:
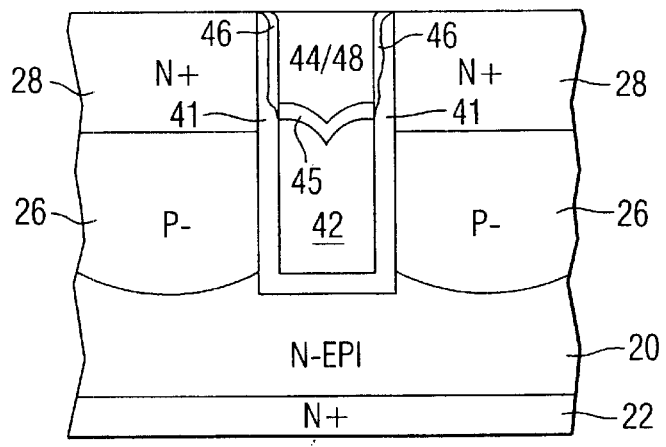

FIG. 6 depicts the removal of excess BPSG and barrier layer from the top surface of substrate, resulting in a planarized BPSG layer 44/48 substantially filling trench 40. Thereafter, suitable metallization is applied to source regions 28, BPSG layer 44/48, and drain region 22 to complete the fabrication of device 10, as shown in FIG. 1.

The invention has been described in detail with particular reference to certain preferred embodiments thereof, but it will be understood that variations and modifications can be effected within the spirit and scope of the invention, which is defined by the claims that follow.

What is claimed is:

1. A process for filling a trench having sidewalls and a floor in a semiconductor device or integrated circuit, said process comprising:

forming an insulating layer on the sidewalls and floor of a trench etched into a semiconductor substrate;

substantially filling the trench with semiconductor material;

removing semiconductor material from an upper portion of the trench;

depositing a first layer of BPSG in the upper portion of the trench, said first layer of BPSG comprising boron and phosphorus in a weight ratio of boron:phosphorus of greater than 1:1;

heating the substrate to a first temperature greater than about 850° C. and up to about 1100° C.;

depositing a second layer of BPSG above the first layer of BPSG, said second layer of BPSG comprising boron and phosphorus in a weight ratio of boron:phosphorus of greater than 1:1; and heating the substrate to a second temperature greater than about 850° C. and up to about 1100° C.

2. The process of claim 1 wherein said substrate comprises silicon, said insulating layer comprises silicon oxide, and said semiconductor material comprises doped polysilicon.

3. The process of claim 1 further comprising:

following said heating the substrate to a second temperature, planarizing the second layer of BPSG, thereby substantially filling the trench.

4. The process of claim 1 further comprising:

immediately following said removing semiconductor material from the upper portion of the trench, forming an insulating barrier layer on the sidewalls of said upper portion of said trench.

5. The process of claim 4 wherein said insulating barrier layer comprises a material selected from the group consisting of an oxide, a nitride, and an oxynitride.

6. The process of claim 4 wherein said insulating barrier layer has a thickness of about 0.05 $\mu$m.

7. The process of claim 1 wherein said first and second temperatures are each about 1050° C.

8. The process of claim 1 wherein the first and second BPSG layers each comprises about 4 wt. % to about 6 wt. % boron and about 3 wt. % to about 4 wt. % phosphorus.

9. The process of claim 8 wherein each of said first and second BPSG layers comprises up to about 9 wt. % of boron and phosphorus together.

10. The process of claim 1 wherein the first BPSG layer is thinner than the second BPSG layer.

11. The process of claim 1 wherein the first BPSG layer has a thickness of about 0.4 $\mu$m.

12. The process of claim 1 wherein the second BPSG layer has a thickness of about 0.6 $\mu$m.

13. The process of claim 1 wherein said trench has a width of about 0.5 $\mu$m and a depth of about 0.5 $\mu$m to about 1.0 $\mu$m.

14. The process of claim 1 wherein said depositing said first and second BPSG layers is carried out using a gaseous composition containing silane, phosphine, diborane, and nitrous oxide.

15. The process of claim 1 wherein said substrate further comprises a heavily doped source region disposed at an upper surface of said substrate and a lightly doped well region underlying said source region, each of said source and well regions being disposed adjacent to a sidewall of said trench.

16. A semiconductor device or integrated circuit comprising at least one trench filled by the process of claim 1.

17. The semiconductor device or integrated circuit of claim 16 comprising a plurality of trenches, said trenches having a pitch of about 1.0 $\mu$m to about 4.0 $\mu$m.

* * * * *